(12) United States Patent
Chen et al.

(10) Patent No.: US 8,084,697 B2
(45) Date of Patent: Dec. 27, 2011

(54) ELECTRO MAGNETIC WAVE SHIELDING DEVICE

(75) Inventors: Yuan-Ho Chen, Taipei (TW); Chun-Ying Yang, Taipei (TW)

(73) Assignee: Inventec Corporation, Taipei (TW)

( * ) Notice: Subject to any disclaimer, the term of this patent is extended or adjusted under 35 U.S.C. 154(b) by 344 days.

(21) Appl. No.: 12/483,624

(22) Filed: Jun. 12, 2009

(65) Prior Publication Data

US 2010/0288551 A1 Nov. 18, 2010

(30) Foreign Application Priority Data

May 15, 2009 (TW) .............................. 98208539 U

(51) Int. Cl.
*H05K 9/00* (2006.01)

(52) U.S. Cl. .... 174/382; 174/386; 361/818; 324/750.27

(58) Field of Classification Search .................. 174/377, 174/382, 386; 361/818; 324/750.27
See application file for complete search history.

(56) References Cited

U.S. PATENT DOCUMENTS 5,477,612 A * 12/1995 Roberts ........................... 29/846
6,545,459 B2 * 4/2003 Boswell et al. .......... 324/750.27

* cited by examiner

*Primary Examiner* — Hung Ngo
(74) *Attorney, Agent, or Firm* — Morris Manning & Martin LLP; Tim Tingkang Xia, Esq.

(57) ABSTRACT

An electro magnetic (EM) wave shielding device includes at least one metal plate and an EM wave absorbing material configured on a lateral side of the metal plate. The lateral side of the metal plate configured with the EM wave absorbing material covers a test point region of a circuit board, thereby absorbing and shielding EM waves generated by the test point region.

6 Claims, 10 Drawing Sheets

ELECTRO MAGNETIC WAVE SHIELDING DEVICE

CROSS-REFERENCE TO RELATED APPLICATIONS

This non-provisional application claims priority under 35 U.S.C. §119(a) on Patent Application No(s). 098208539 filed in Taiwan, R.O.C. on May 15, 2009 the entire contents of which are hereby incorporated by reference.

BACKGROUND OF THE INVENTION

1. Field of the Invention

The present invention relates to a shielding device, and more particularly to an electro magnetic (EM) wave shielding device, which covers a test point region of a circuit board.

2. Related Art

With the rapid progress of the electronic science, functions and applications of various electronic products become increasingly diversified, and accordingly, the design and development of the printed circuit boards (PCBs) disposed in the electronic products face greater challenge. During the manufacturing of the circuit boards, in order to exclude non-researching and non-designing faults, for example, short circuit or disconnecting problems resulted from a poor manufacturing process of the circuit boards, or problems (for example, mis-insertion of parts) resulted from carelessness during the assembling process on the production line, in-circuit test (ICT) including short circuit or disconnecting test must be performed before a large shipment of circuit boards, so as to ensure the shipment quality of the circuit boards.

Currently, as for a method for confirming the quality of the circuit board, specific wires for testing electrical functions are usually configured among a plurality of wires printed on a surface of the circuit board. Meanwhile, test points electrically connected to the wires are disposed on the circuit board. Then, testing jigs for testing the test points are provided, so as to perform the ICT testing operation on the quality of the circuit board. However, once the quality test of the circuit board is finished, the test points disposed on the circuit board do not have any other function, but become one of the sources for producing EM interferences (EMIs) of the PCB.

The EMI has become one of the severe problems in the current electronic industry, which causes interferences to other electronic elements disposed on the circuit board, and influences the normal running operations thereof, such that the EMI must be reduced as much as possible. Recently, considering the method for lowering the EMI, in addition to disposing a ground layer on the circuit board, a ground copper foil is usually laid on a test point region, so as to increase a grounding area, thereby lowering the EMI by reducing the impedance of certain grounding loops. Alternatively, a metal shield mask is disposed on the test point region, thereby lowering the EMI. However, the EM wave shielding capability of the copper foil is rather limited, and thus, no desirable EMI shielding effects can be provided. Although the EM wave shielding capability of the metal shield mask is better than that of the copper foil, the metal shield mask occupies a certain volume in usage, and a space on the circuit board for disposing the metal shield mask is quite limited, such that the usage of the metal shield mask is restricted to a large extent.

Therefore, as for the EMI problem of the test point region on the circuit board, people in the industry are still searching for an EMI shielding method capable of overcoming the usage restrictions due to the limited space of the circuit board and improving the shielding capability.

SUMMARY OF THE INVENTION

In view of the above problems, the present invention is an EM wave shielding device, which is capable of modifying problems of the conventional methods for preventing or lowering EMIs that an EMI shielding effect is rather limited, and is restricted by a using space of a circuit board.

The present invention provides an EM wave shielding device, covering a test point region of a circuit board, in which the circuit board is disposed in a case, and the test point region of the circuit board generates EM waves. The EM wave shielding device comprises at least one metal plate, and at least one EM wave absorbing material configured on a lateral side of the metal plate. The lateral side of the metal plate configured with the EM wave absorbing material covers the test point region, thereby absorbing and shielding the EM waves emitted from the test point region.

In the EM wave shielding device according to the present invention, an EM wave absorbing material is adhered to the lateral side of the metal plate, and the EM wave absorbing material covers the test point region of the circuit board, thereby absorbing the EM waves generated by the test point region. Meanwhile, the metal plate is further used to block the EM waves penetrating the EM wave absorbing material, so that the EM waves are effectively absorbed and isolated at the test point region of the circuit board, without being delivered to the electronic parts on the other regions of the circuit board. In addition, the EM wave shielding device according to the present invention covers the test point region in a shape of a thin plate structure, which is not restricted by the available space of the circuit board.

The above descriptions of the disclosure of the present invention and the following descriptions of the embodiments are merely intended to exemplify and explain the spirits and principles of the present invention, and offer further explanations on the claims of the present invention.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

An EM wave shielding device according to the present invention is used to cover a test point region of a circuit board, for example, a test point region of a single-sided, double-sided, or multi-layer PCB, a logic board, or an etched circuit board, thereby absorbing and shielding EM waves generated by the test point region.

Figure 1:
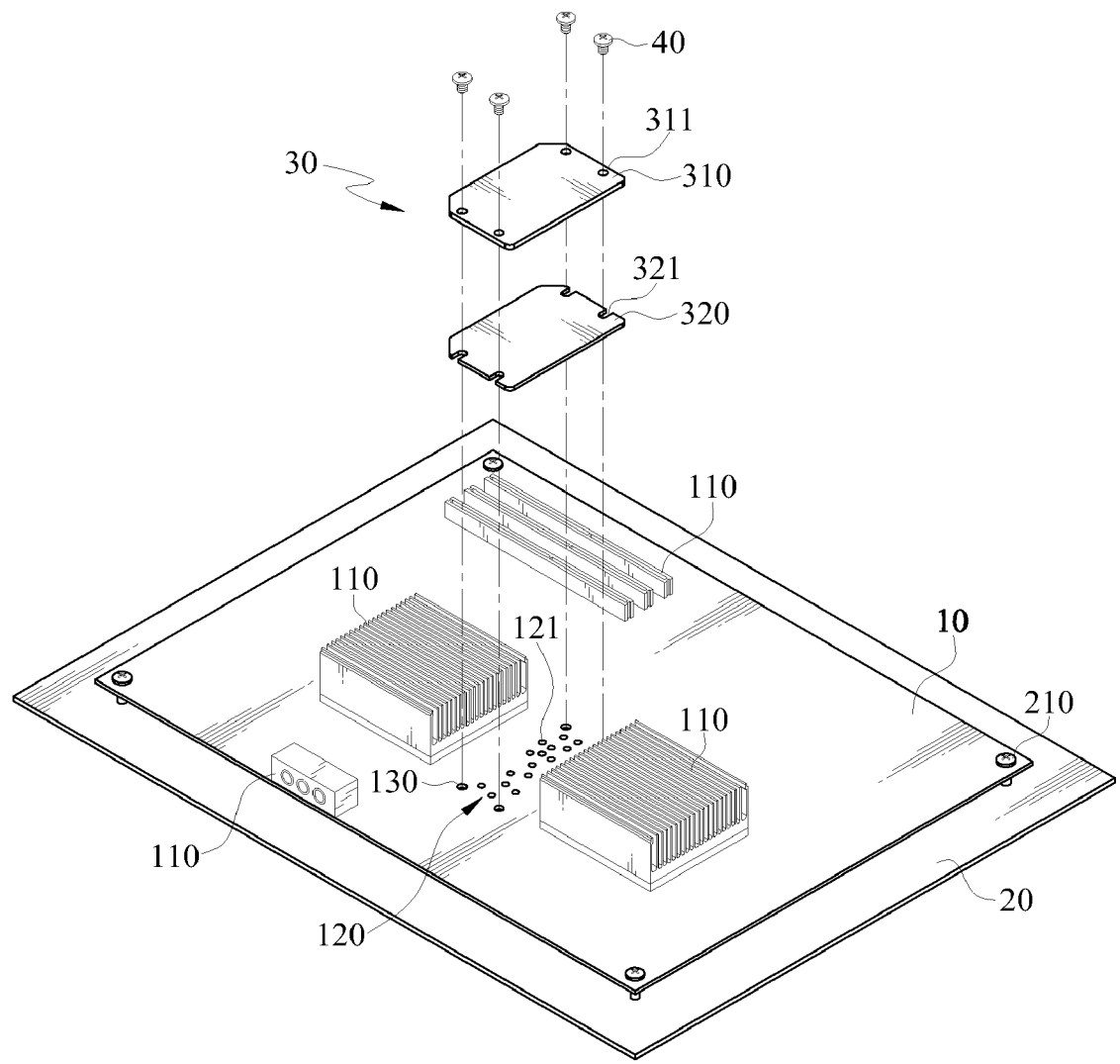
FIG. 1 is a schematic three-dimensional exploded view of a first embodiment of the present invention.
Figure 2:
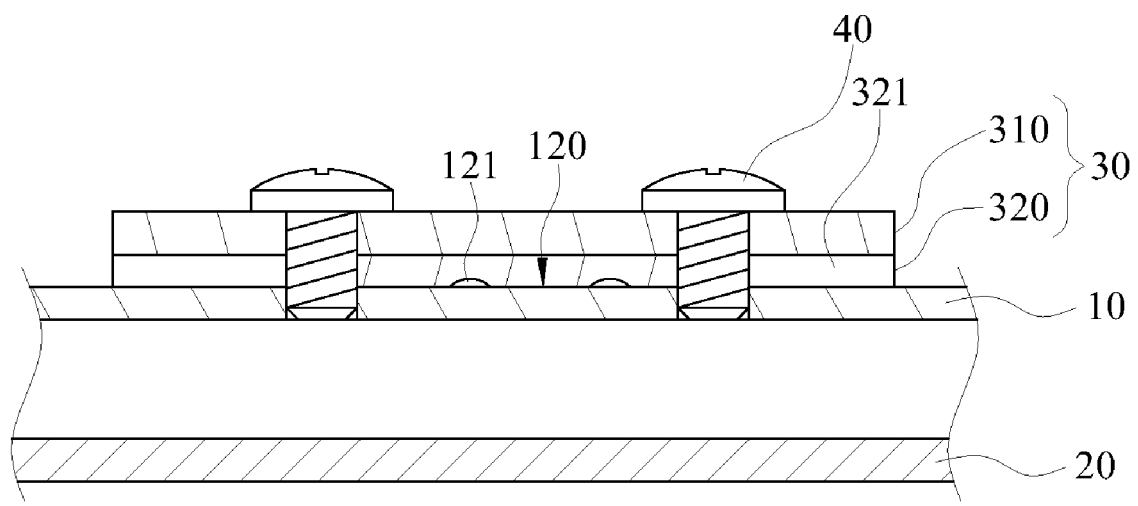
FIG. 2 is a schematic cross-sectional view of the first embodiment of the present invention.

Referring to FIGS. 1 and 2, a circuit board 10 is disposed in a case 20 of an electronic device, and is fastened on the case 20 through screws 210. A plurality of electronic elements 110, for example, chipsets, heat sink, interface card slots, capacitors, and power outlet, a test point region 120, and a plurality of fixing holes 130 are disposed on the circuit board 10. The plurality of fixing holes 130 is opened on positions of the circuit board 10 adjacent to the test point region 120. A plurality of test points 121 is distributed on the test point region 120, and generates EM waves. An EM wave shielding device 30 according to a first embodiment of the present invention comprises a metal plate 310 and an EM wave absorbing material 320. A thickness of the metal plate 310 is approximately 0.75 mm to 1.5 mm, and a thickness of the EM wave absorbing material 320 is approximately 0.4 mm to 0.6 mm. The EM wave absorbing material 320 is disposed on a lateral side of the metal plate 310. However, the thickness of the metal plate 310 and the thickness of the EM wave absorbing material 320 may be varied correspondingly according to the practical using demands without being limited to the thickness mentioned in this embodiment.

When the EM wave shielding device 30 according to the present invention is installed on the circuit board 10, the lateral side of the metal plate 310 configured with the EM wave absorbing material 320 covers the test point region 120, and then the EM wave shielding device 30 is fixed on the circuit board 10 by using an adhesive (not shown). Alternatively, referring to FIG. 1, a plurality of via holes 311 is opened on surrounding peripheries of the metal plate 310, a plurality of notches 321 is disposed on the EM wave absorbing material 320, and the plurality of via holes 311 and the plurality of notches 321 both correspond to the fixing holes 130 around the test point region 120. Then, fixing parts 40, for example, screw bolts, plugs, or screws, sequentially pass through the via holes 311 of the metal plate 310, the notches 321 of the EM wave absorbing material 320, and the fixing holes 130 of the circuit board 10, such that the EM wave shielding device 30 is fixed on the test point region 120.

If the fixing parts 40 are in a form of screws, the screws have a plurality of screw teeth, and inner edges of the via holes of the metal plate and the fixing holes of the circuit board have a plurality of screw threads matching with the screw teeth of the screws, such that the screw teeth of the screws are fitted with the screw threads on the inner edges of the via holes of the metal plate and the fixing holes of the circuit board, and then the screws are fastened in the via holes and the fixing holes, so that the metal plate and the EM wave absorbing material are stably disposed on the circuit board. When the fixing parts 40 are in a form of screw bolts, each of the screw bolts has a head portion and a locking portion on two ends respectively, in which a diameter of the head portion is greater than that of the locking portion, the locking portion has a plurality of screw teeth, and a diameter of the locking portion matches with an inner diameter of the via holes of the metal plate and an inner diameter of the fixing holes of the circuit board. In usage, the locking portion of each screw bolt sequentially passes through the via hole of the metal plate, the notch of the EM wave absorbing material, and the fixing hole of the circuit board, and is protruded from a lateral side of the circuit board facing the case. Then, a screw nut is screwed on the screw teeth of the locking portion of the screw bolt. In this way, the metal plate, the EM wave absorbing material, and the circuit board are clamped between the head portions of the screw bolts and the screw nuts, thereby increasing a holding strength of the EM wave shielding device on the circuit board. When the fixing parts 40 are in a form of plugs, each plug usually has a head portion and an elastic flange capable of shrinking inwards on two ends respectively, and after passing through the fixing hole of the circuit board, the plug is clipped on the circuit board by using the elastic flange, such that the metal plate, the EM wave absorbing material, and the circuit board are clamped and fixed between the head portions and the elastic flanges of the plugs, thereby fixing the EM wave shielding device on the circuit board.

In the first embodiment of the present invention, the fixing parts 40 in the form of screws are taken as an example for description, but the present invention is not limited here.

Accordingly, after the EM wave shielding device 30 is fixed on the circuit board 10 through the fixing parts 40, the EM wave absorbing material 320 and the metal plate 310 are sequentially formed on the test point region 120 of the circuit board 10, such that the EM waves emitted from the test point region 120 are firstly absorbed by the EM wave absorbing material 320, thereby lowering a strength of the EM waves, and then the EM waves are blocked by the metal plate 310 disposed on an external part, thereby being restricted in the test point region 120, so that the EM waves generated by the test point region 120 cannot be delivered to the other electronic elements 110, for example, interface card slots and heat sink on the circuit board 10, thereby effectively lowering an EMI produced by the test point region 120 on the electronic elements 110.

Figure 3:
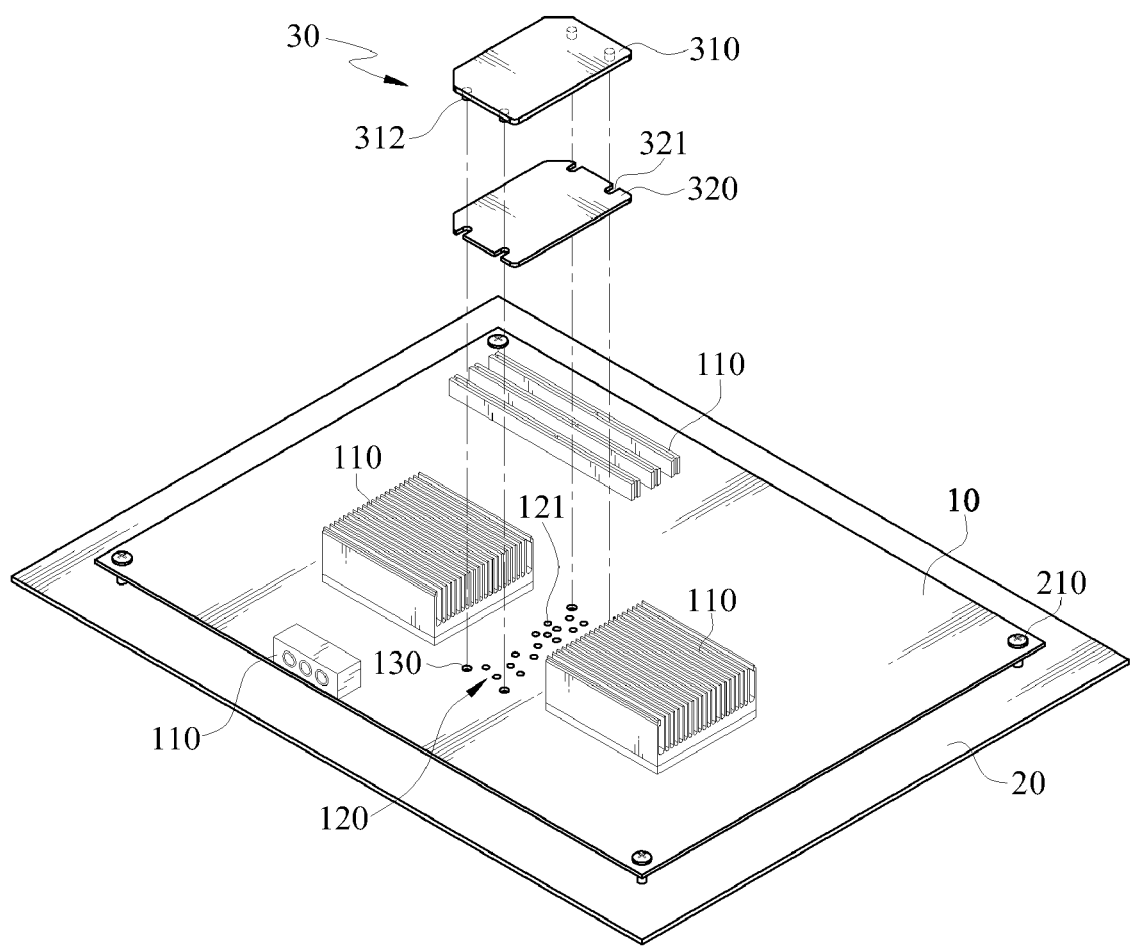
FIG. 3 is a schematic three-dimensional exploded view of the first embodiment of the present invention, in which a metal plate is fixed on a circuit board by positioning posts.
Figure 4:
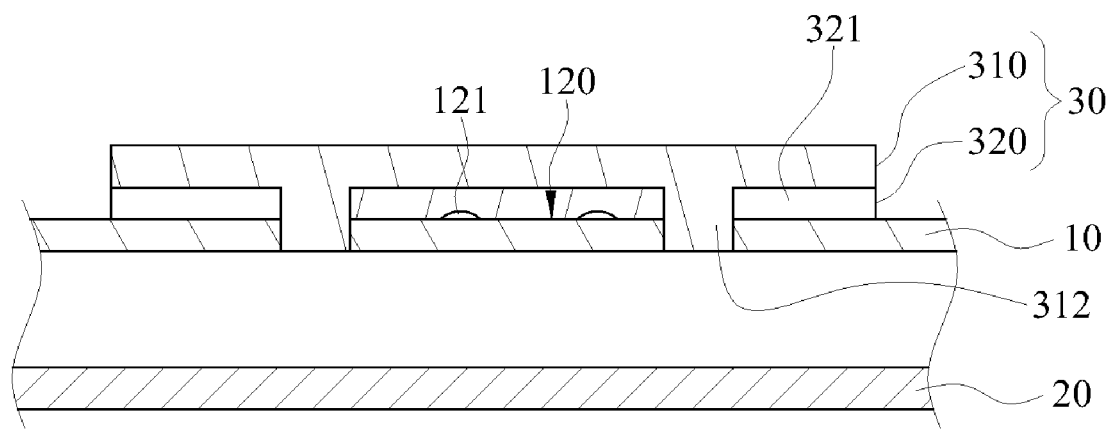
FIG. 4 is a schematic cross-sectional view of the first embodiment of the present invention, in which the metal plate is fixed on a circuit board by the positioning posts.

In addition to fixing the EM wave shielding device of the present invention to the circuit board by using the fixing parts, referring to FIGS. 3 and 4, a plurality of positioning posts 312 is extended from a lateral side of the metal plate 310 facing the circuit board 10, and the positions where the positioning posts 312 are protruded on the metal plate 310 correspond to the plurality of fixing holes 130 of the circuit board 10. Therefore, the plurality of positioning posts 312 of the metal plate 310 correspondingly passes through the plurality of fixing holes 130 of the circuit board 10, such that the EM wave shielding device 30 is fixed on the test point region 120 of the circuit board 10, which is merely a different operation manner for fixing the EM wave shielding device 30 on the circuit board 10, and the present invention is not limited here.

Figure 5:
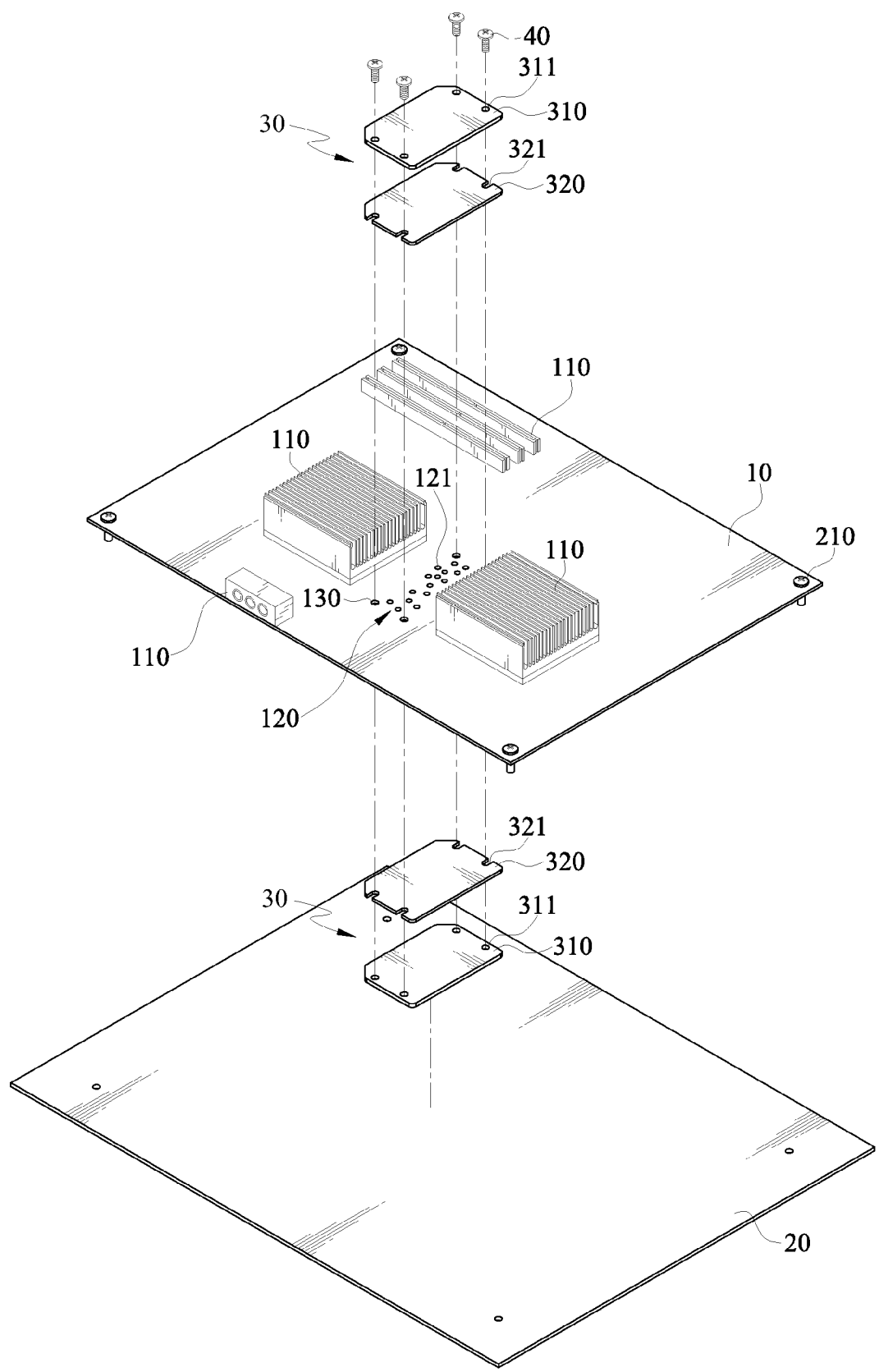
FIG. 5 is a schematic three-dimensional exploded view of the first embodiment of the present invention, in which an EM wave shielding device is disposed on two opposite lateral sides of a test point region.
Figure 6:
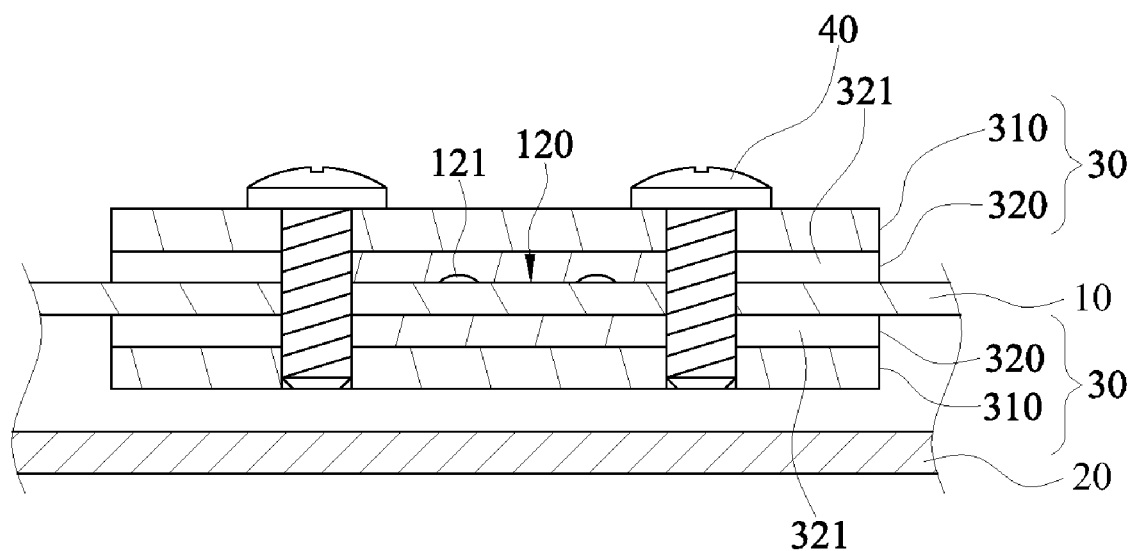
FIG. 6 is a schematic cross-sectional view of the first embodiment of the present invention, in which the EM wave shielding device is disposed on the two opposite lateral sides of the test point region.

In addition, the EM wave shielding device 30 according to the present invention may be disposed on two opposite lateral sides of the circuit board 10, thereby enhancing the EM wave shielding performance. Referring to FIGS. 5 and 6, the EM wave shielding device 30 according to the present invention is respectively disposed on two opposite lateral sides of the circuit board 10, and corresponds to the test point region 120 of the circuit board 10. The lateral side of each metal plate 310 configured with the EM wave absorbing material 320 respectively covers the test point region 120, such that the test point region 120 is sandwiched between two metal plates 310. Therefore, due to being absorbed by the EM wave absorbing materials 320 and isolated by the metal plates 310, the EM waves generated by the test point region 120 has a lower strength, so as to prevent the EM waves that are not absorbed by the EM wave absorbing materials 320 from overflowing from the other lateral side of the circuit board 10 opposite to the test point region 120, and prevent other electronic elements 110 on the circuit board 10 from being interfered by the EM waves to affect the operation performance thereof.

Figure 7:
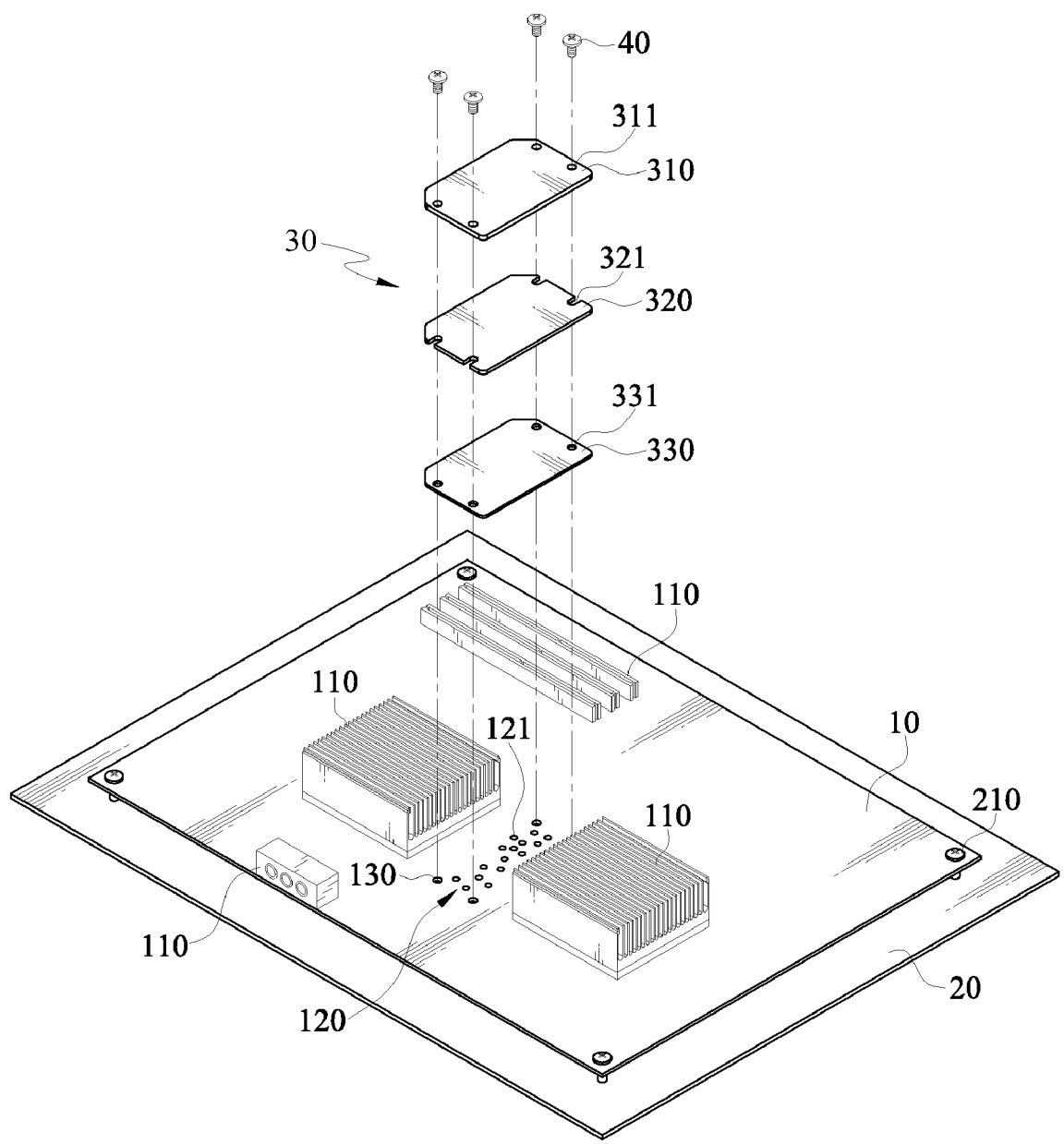
FIG. 7 is a schematic three-dimensional exploded view of a second embodiment of the present invention.
Figure 8:
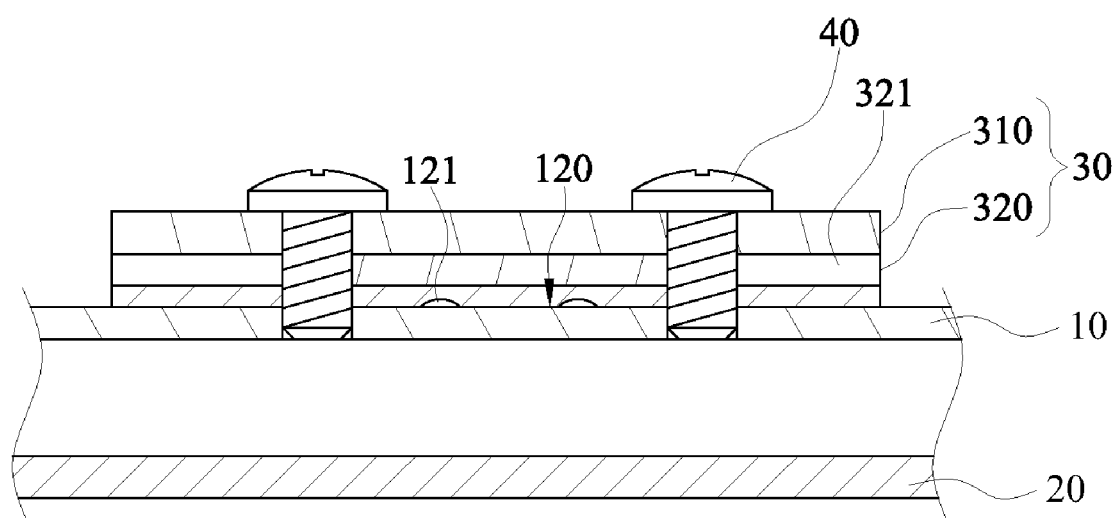
FIG. 8 is a schematic cross-sectional view of the second embodiment of the present invention.

Referring to FIGS. 7 and 8, a circuit board 10 is disposed in a case 20 of an electronic device, and is fastened on the case 20 through screws 210. A plurality of electronic elements 110, a test point region 120, and a plurality of fixing holes 130 are disposed on the circuit board 10. The plurality of fixing holes 130 is opened on positions of the circuit board 10 adjacent to the test point region 120. A plurality of test points 121 is distributed on the test point region 120, and generates EM waves. An EM wave shielding device 30 according to a second embodiment of the present invention comprises a metal plate 310, an EM wave absorbing material 320, and a mylar 330. A thickness of the metal plate 310 is approximately 0.75 mm to 1.5 mm. A plurality of via holes 311 is opened on the metal plate 310, and the positions of the via holes 311 correspond to the fixing holes 130 of the circuit board 10. The EM wave absorbing material 320 is disposed between the metal plate 310 and the mylar 330. A thickness of the EM wave absorbing material 320 is approximately 0.4 mm to 0.6 mm, and the EM wave absorbing material 320 is configured with notches 321 corresponding to the via holes of the metal plate 310. A thickness of the mylar 330 is approximately 0.2 mm to 0.3 mm, and the mylar 330 is further opened with through holes 331 corresponding to the via holes 311 of the metal plate 310. However, the thickness of the metal plate 310, the thickness of the EM wave absorbing material 320, and the thickness of the mylar 330 may be correspondingly varied according to the practical using demands, which are not limited to the thickness mentioned in this embodiment.

When the EM wave shielding device 30 according to the second embodiment of present invention is installed on the circuit board 10, a lateral side of the mylar 330 covers the test point region 120 of the circuit board 10, and then the mylar 330, the EM wave absorbing material 320, and the metal plate 310 are sequentially formed on the test point region 120, and finally, fixing parts 40 sequentially pass through the via holes 311 of the metal plate 310, the notches 321 of the EM wave absorbing material 320, the through holes 331 of the mylar 330, and the fixing holes 130 of the circuit board 10, so as to fix the EM wave shielding device 30 on the test point region 120 of the circuit board 10. The mylar 330 is used to isolate and protect a circuit layout (not shown) in the test point region 120, and provides an excellent electrical isolation effect. Then, the EM wave absorbing material 320 absorbs the EM waves generated by the test point region 120, and the EM waves are further blocked by the metal plate 310, thereby lowering an EMI of the EM waves generated by the test point region 120 on the electronic elements 110 on other regions of the circuit board 10.

Figure 9:
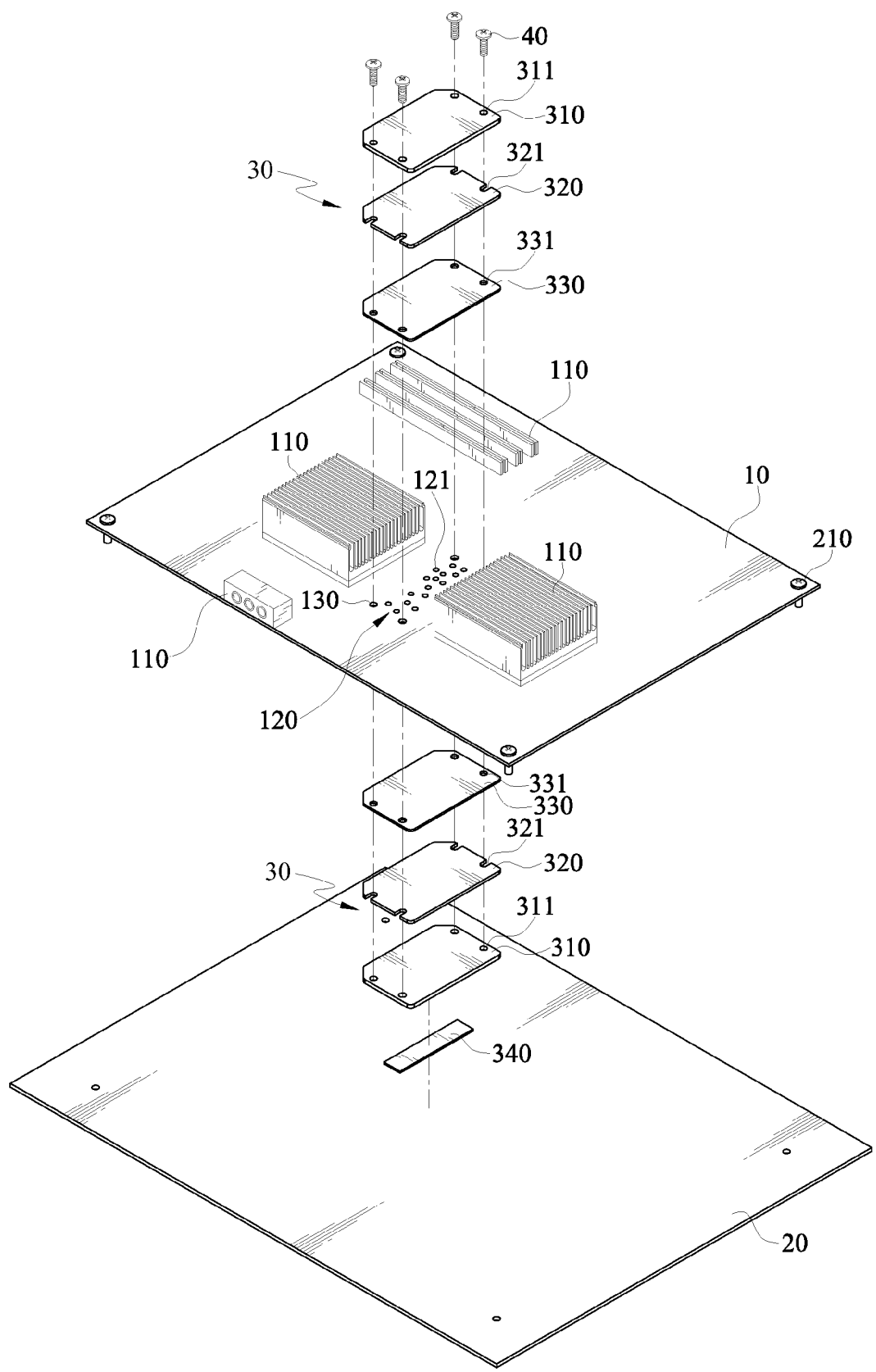
FIG. 9 is a schematic three-dimensional exploded view of a third embodiment of the present invention.
Figure 10:
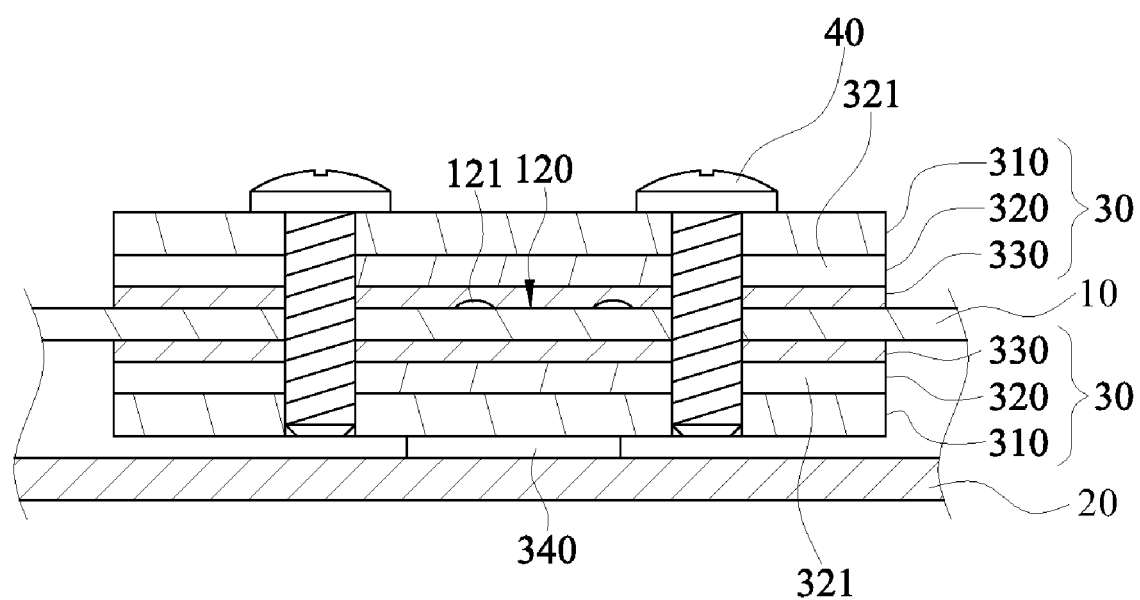
FIG. 10 is a schematic cross-sectional view of the third embodiment of the present invention.

FIGS. 9 and 10 are respectively a schematic three-dimensional exploded view and a schematic cross-sectional view of a third embodiment of the present invention. Referring to FIGS. 9 and 10, an EM wave shielding device according to the third embodiment of the present invention is used to cover a test point region of a circuit board, so as to isolate and lower the strength of EM waves emitted from the test point region. The circuit board is disposed in a case 20 of the electronic device, and is fastened on the case 20 through screws 210. A plurality of electronic elements 110, a test point region 120, and a plurality of fixing holes 130 are disposed on the circuit board 10. The plurality of fixing holes 130 is opened on positions of the circuit board 10 adjacent to the test point region 120. A plurality of test points 121 is distributed on the test point region 120, and generates EM waves.

The EM wave shielding device 30 comprises two metal plates 310, two EM wave absorbing materials 320, two mylars 330, and an EMI gasket 340. Firstly, the two EM wave absorbing materials 320 are respectively disposed on a lateral side of each of the two metal plates 310, and then, the two mylars 330 are respectively disposed on the two EM wave absorbing materials 320, so as to form two stacking structures of the mylar 330, the EM wave absorbing material 320, and the metal plate 310 respectively. Then, a lateral side of each stacking structure having the mylar 330 covers two opposite lateral sides of the circuit board 10 respectively, and corresponds to a position of the test point region 120 on the circuit board 10 respectively. Then, the two stacking structures are fixed on the circuit board 10 through fixing parts 40 (shown in FIG. 10), so as to prevent the EM waves that are not absorbed by the EM wave absorbing materials 320 from overflowing from the other lateral side of the circuit board 10 opposite to the test point region 120. Finally, the EMI gasket 340 is disposed between the case 20 and the metal plate 310, and the EMI gasket 340 respectively contacts the case 20 and the metal plate 310, and thus, the configuration of the EM wave shielding device 30 is completed.

Therefore, the mylars 330 isolate and protect a circuit layout (not shown) in the test point region 120 of the circuit board 10, and provide an insulating protection effect. The EM wave absorbing materials 320 absorb the EM waves generated by the test point region 120. The metal plates 310 isolate and block the EM waves, such that the EM waves cannot be delivered to the other regions outside the test point region 120 of the circuit board 10. Meanwhile, by using the EMI gasket 340, the EM waves are guided and drained to the case 20, such that the harm of the EMI generated by the test point region on the electronic elements 110 of the circuit board 10 is reduced to the lowest degree, thereby satisfying the level specified in the legal safety code of the EMI in each country.

The EM wave shielding device according to the present invention comprises the metal plate and the EM wave absorbing material. The EM wave absorbing material covers the test point region of the circuit board, such that the EM waves generated by the test point region are firstly absorbed by the EM wave absorbing material. After the strength of the EM waves is reduced, the metal plate further blocks the EM waves in the test point region, such that the EM waves generated by the test point region cannot be delivered to the other regions of the circuit board, thereby effectively lowering the EMI produced by the test point region on the electronic elements on the circuit board. Furthermore, the EM wave shielding device according to the present invention is disposed in a form of a thin plate, and when being installed on the circuit board, the EM wave shielding device is adhered to the circuit board, which does not influence other electronic elements already disposed on the circuit board and is not restricted by the limited available space either.

In addition, as for the usage of the EM wave absorbing material, the EM wave absorbing material generally has a high cost, and if a large number of EM wave absorbing materials are used to prevent the EMI of the circuit board, a manufacturing cost of the circuit board is greatly increased. If merely the metal plate is used as the material for lowering the EMI, a metal shield mask is generally formed to lower the EMI. In this case, it is still doubted that the usage of the metal material also results in an increased manufacturing cost. Therefore, the EM wave absorbing material according to the present invention not only achieves an excellent EMI shielding efficiency, but also reduces the amount of the required EM wave absorbing materials and metal plates, so as to lower the manufacturing cost.

What is claimed is:

1. An electro magnetic (EM) wave shielding device, adapted to cover a test point region of a circuit board, wherein the circuit board is disposed in a case, and the test point region of the circuit board generates an EM wave, the EM wave shielding device comprising:
   at least one metal plate; and
   at least one EM wave absorbing material, configured on a lateral side of the metal plate;
   wherein the lateral side of the metal plate configured with the EM wave absorbing material covers the test point region, thereby absorbing and shielding the EM wave, a plurality of fixing holes is formed on positions of the circuit board adjacent to the test point region, the metal plate has a plurality of via holes corresponding to the fixing holes, and a plurality of fixing parts pass through the via holes and the fixing holes, so as to fix the metal plate on the circuit board.

2. The EM wave shielding device according to claim 1, further comprising a mylar, disposed on a lateral side of the EM wave absorbing material facing the test point region.

3. The EM wave shielding device according to claim 1, further comprising an EM interference (EMI) gasket, disposed between the metal plate and the case, and respectively contacting the metal plate and the case.

4. The EM wave shielding device according to claim 1, further comprising two metal plates and two EM wave absorbing materials respectively configured on lateral sides of the two metal plates, wherein the two metal plates and the two EM wave absorbing materials are respectively disposed on two opposite lateral sides of the circuit board, and correspondingly cover a position of the test point region.

5. The EM wave shielding device according to claim 1, wherein the fixing parts are screw bolts, screws, or plugs.

6. An electro magnetic (EM) wave shielding device, adapted to cover a test point region of a circuit board, wherein the circuit board is disposed in a case, and the test point region of the circuit board generates an EM wave, the EM wave shielding device comprising:
   at least one metal plate; and
   at least one EM wave absorbing material, configured on a lateral side of the metal plate;
   wherein the lateral side of the metal plate configured with the EM wave absorbing material covers the test point region, thereby absorbing and shielding the EM wave, a plurality of fixing holes is formed on positions of the circuit board adjacent to the test point region, the metal plate has a plurality of positioning posts corresponding to the fixing holes, and the positioning posts of the metal plate correspondingly pass through the fixing holes, so as to fix the metal plate on the circuit board.

* * * * *